United States Patent
Takenawa

(10) Patent No.: US 9,829,862 B2
(45) Date of Patent: Nov. 28, 2017

(54) DRIVING UNIT AND TIMEPIECE

(71) Applicant: CASIO COMPUTER CO., LTD., Tokyo (JP)

(72) Inventor: Hideo Takenawa, Hamura (JP)

(73) Assignee: CASIO COMPUTER CO., LTD. (JP)

( * ) Notice: Subject to any disclaimer, the term of this patent is extended or adjusted under 35 U.S.C. 154(b) by 494 days.

(21) Appl. No.: 14/477,310

(22) Filed: Sep. 4, 2014

(65) Prior Publication Data

US 2015/0071042 A1 Mar. 12, 2015

(30) Foreign Application Priority Data

Sep. 6, 2013 (JP) .................. 2013-184915

(51) Int. Cl.
| | | |
|---|---|---|
| *H01L 41/09* | (2006.01) | |
| *G04C 3/14* | (2006.01) | |
| *H02N 2/10* | (2006.01) | |
| *H02N 2/14* | (2006.01) | |

(52) U.S. Cl.
CPC ............... *G04C 3/14* (2013.01); *H02N 2/101* (2013.01); *H02N 2/103* (2013.01); *H02N 2/14* (2013.01); *H01L 41/094* (2013.01); *H01L 41/0926* (2013.01)

(58) Field of Classification Search
CPC ..................... H01L 41/0926; H01L 41/094
USPC ............. 310/316.01, 317, 323.02, 328
IPC ............................... H02N 2/00
See application file for complete search history.

(56) References Cited

U.S. PATENT DOCUMENTS

| 4,782,262 | A | 11/1988 | Kiyo-Oka | |
|---|---|---|---|---|
| 7,196,453 | B2 * | 3/2007 | Izenson | H02N 2/105 |
| | | | | 310/316.01 |
| 2006/0261705 | A1 | 11/2006 | Izenson et al. | |

FOREIGN PATENT DOCUMENTS

| CN | 101291120 A | 10/2008 |
|---|---|---|
| JP | S61-22776 A | 1/1986 |
| JP | H3-14993 U | 2/1999 |
| JP | 2000-152671 | 5/2000 |
| JP | 2003-339176 A | 11/2003 |
| JP | 2010-213537 A | 9/2010 |
| JP | 2011-103749 A | 5/2011 |
| JP | 2012-200050 A | 10/2012 |

OTHER PUBLICATIONS

Chinese Office Action and Search Report dated Apr. 25, 2016 for Chinese Patent Application No. 201410466424.7 and English translation of the same. (15 pages).
Japanese Office Action dated Jul. 25, 2017 issue in corresponding for Japanese Patent Application No. 2013-184915 and English translation of the same. (13 pages).

\* cited by examiner

*Primary Examiner* — Karen B Addison

(57) ABSTRACT

A driving unit includes a rotor, a plurality of vibratory members, and a driving circuit. The vibratory members each include an action part in contact with the outer periphery of the rotor and a motional part including an expansion-and-contraction driver to expand and contract in response to an applied voltage. The motional part allows the action part to slide along the rotational direction of the rotor. The driving circuit applies voltages to the expansion-and-contraction drivers. The vibratory members are disposed in such a way that the action parts of the vibratory members hold the rotor between the action parts.

16 Claims, 9 Drawing Sheets

DRIVING UNIT AND TIMEPIECE

CROSS-REFERENCE TO RELATED APPLICATION

This application is based upon and claims the benefit of priority under 35 USC 119 of Japanese Patent Application No. 2013-184915 filed on Sep. 6, 2013, the entire disclosure of which, including the description, claims, drawings and abstract, is incorporated herein by reference in its entirety.

BACKGROUND OF THE INVENTION

1. Field of the Invention

The present invention relates to a driving unit and a timepiece.

2. Description of Related Art

Conventional driving units include elements, such as piezoelectric elements or electrostrictive elements, which can expand and contract under applied voltage.

Examples of the driving units utilizing the piezoelectric effect of piezoelectric elements include a stacked driving unit driving with expansion/contraction of multiple stacked piezoelectric elements under applied voltage; a bimorph driving unit including two bonded plate piezoelectric elements that can be warped in the direction perpendicular to the longitudinal direction of the piezoelectric elements (i.e., the direction perpendicular to the bonded surfaces of the piezoelectric elements) by the applied voltage causing expansion of one of the piezoelectric elements and contraction of the other piezoelectric element; and a unimorph driving unit including a metal plate with one surface bonded to a plate piezoelectric element and can be warped by expansion/contraction of the piezoelectric element under applied voltage.

Such a driving unit including piezoelectric elements has a relatively small size and light weight. The driving unit is especially advantageous when installed in a small accommodation space of a compact electronic device, such as a watch.

Although the stacked driving unit has strong driving force and is highly responsive, the driving unit requires high voltage and high frequency for the driving, resulting in high power consumption. The unimorph or bimorph driving unit, which includes a single-plate piezoelectric element rather than stacked piezoelectric elements, consumes lower power but outputs weak driving force and is inferior in responsiveness. Eagerly anticipated is a technique to increase the reliability of the driving units for practical use.

For example, Japanese Unexamined Patent Application Publication No. 2000-152671 discloses an ultrasonic motor including ultrasonic oscillators (piezoelectric oscillators) that generate ultrasonic vibrations under applied voltage. The ultrasonic motor disclosed in Japanese Unexamined Patent Application Publication No. 2000-152671 includes drivers each including two ultrasonic oscillators (piezoelectric oscillators) orthogonal to each other, a rotor, pushers to push the drivers against the outer periphery of the rotor, and AC sources to supply the two ultrasonic oscillators with AC signals having different phases. Under voltage applied to the ultrasonic oscillators, the drivers generate ultrasonic vibrations and come into contact with the outer periphery of the rotor at the tips, to rotate the rotor.

The driving unit disclosed in Japanese Unexamined Patent Application Publication No. 2000-152671 includes multiple drivers each including two ultrasonic oscillators (piezoelectric oscillators) around the rotor. Unfortunately, this configuration causes complication and an increase in size of the device.

The invention relates to a driving unit having a relatively simple structure, a small size, and a light weight while achieving stable rotation of the rotor, and a timepiece including the driving unit.

SUMMARY OF THE INVENTION

One aspect of the present invention is a driving unit including a rotor; a plurality of vibratory members each including an action part in contact with an outer periphery of the rotor, and a motional part including an expansion-and-contraction driver to expand and contract in response to an applied voltage, the motional part allowing the action part to slide along a rotational direction of the rotor; and a driving circuit to apply voltages to the expansion-and-contraction drivers, wherein the vibratory members are disposed in such a way that the action parts of the vibratory members hold the rotor between the action parts.

BRIEF DESCRIPTION OF THE DRAWINGS

The above and other objects, advantages and features of the present invention will become more fully understood from the detailed description given hereinbelow and the appended drawings which are given byway of illustration only, and thus are not intended as a definition of the limits of the present invention, and wherein.

DESCRIPTION OF THE PREFERRED EMBODIMENTS

First Embodiment

A driving unit and a timepiece including the driving unit according to a first embodiment of the invention will now be described with reference to FIGS. 1 to 7.

The driving unit according to the embodiment is applied, for example, to rotate a disk indicator (e.g., a disk indicator 510 illustrated in FIG. 7) that constitutes a date indicator of a watch, or to operate a hand driving mechanism for driving hands. The driving unit according to the invention should not be limited to the embodiment and is applicable to various fields.

Figure 1:
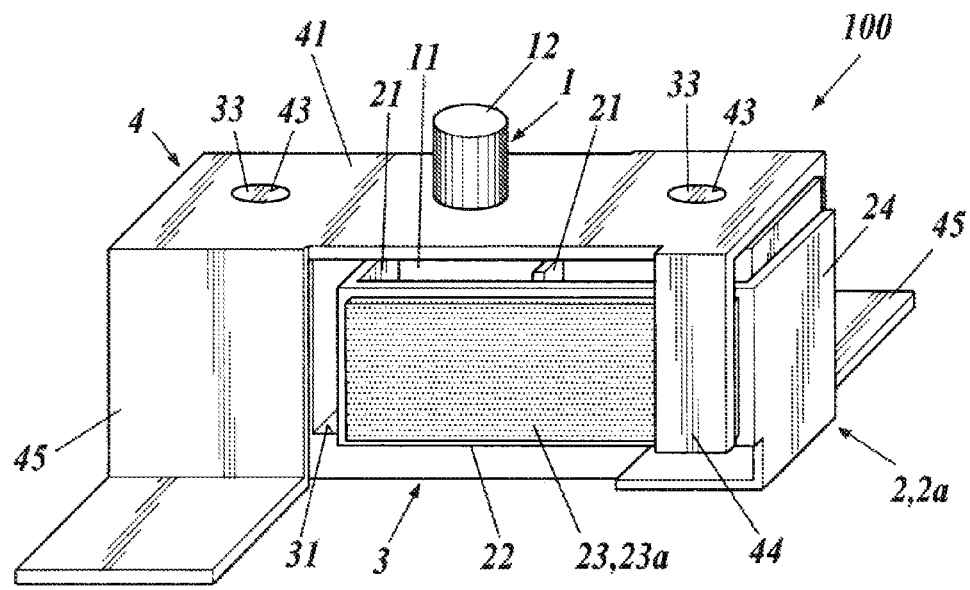
FIG. 1 is a perspective view of a driving unit according to a first embodiment.
Figure 2:
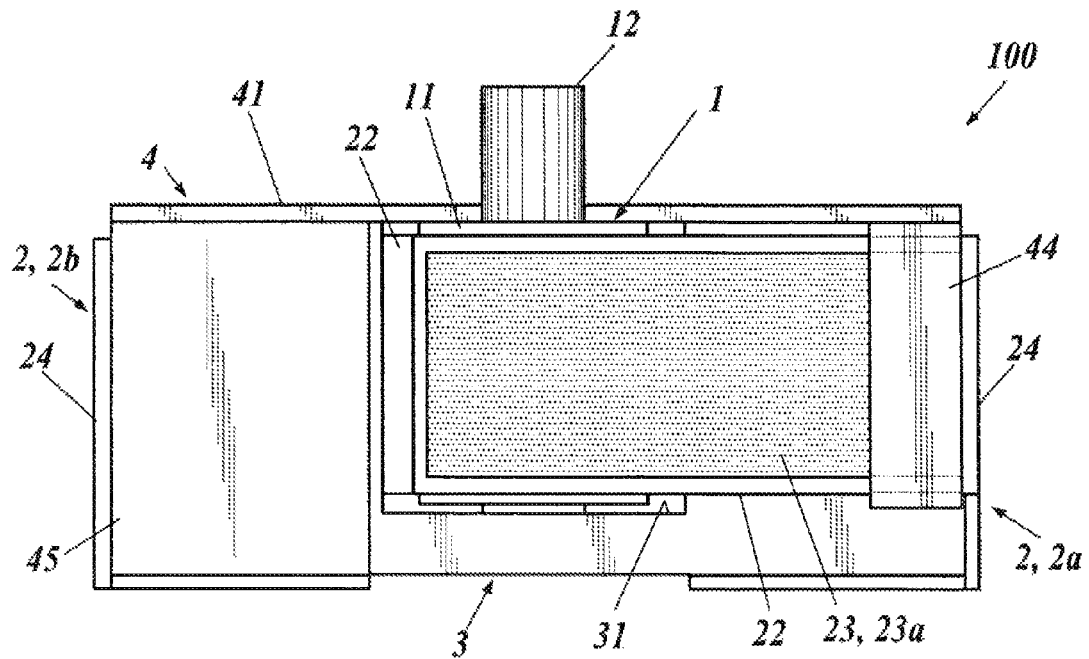
FIG. 2 is a side view of a driving unit according to the first embodiment.
Figure 3:
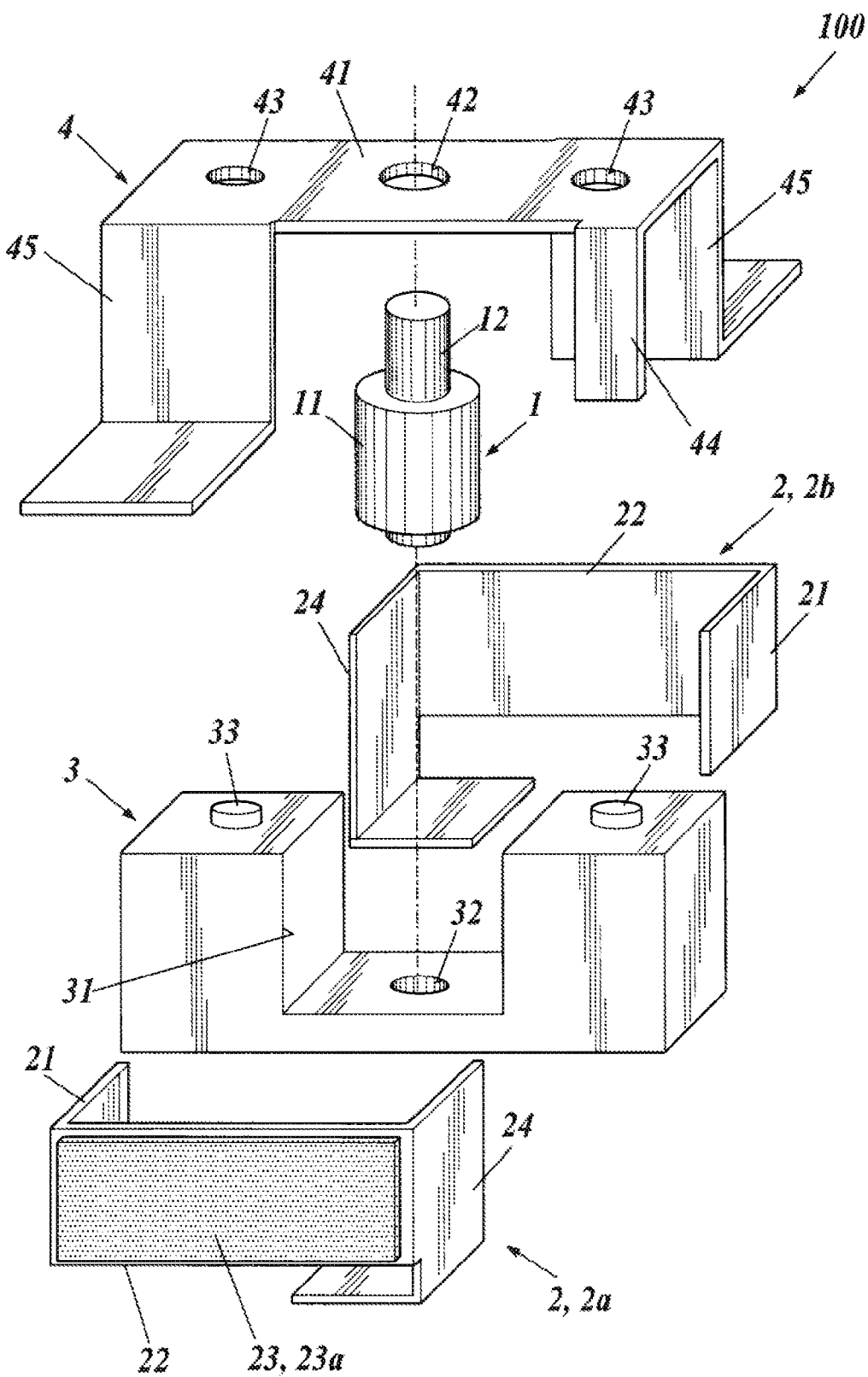
FIG. 3 is an exploded perspective view of a driving unit according to the first embodiment.
Figure 5:
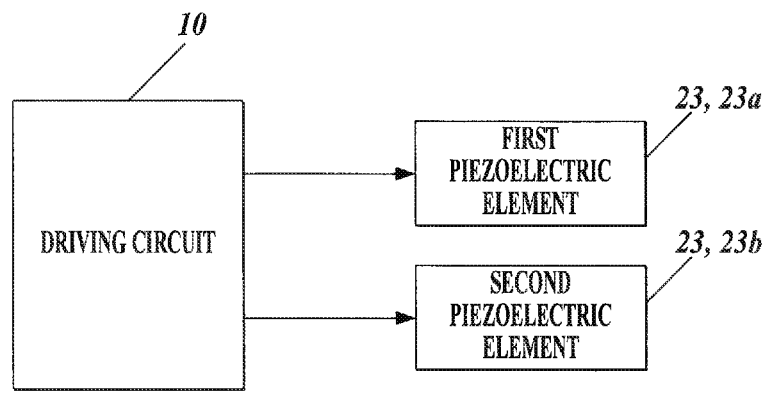
FIG. 5 is a block diagram illustrating the main configuration of a driving unit according to the first embodiment.

FIG. 1 is a perspective view of a driving unit according to the embodiment. FIG. 2 is a side view of the driving unit in FIG. 1. FIG. 3 is an exploded perspective view of the driving unit in FIG. 1. FIG. 5 is a block diagram illustrating the main configuration of the driving unit according to the embodiment.

A driving unit 100 includes a rotor 1, multiple vibratory members 2 (a first vibratory member 2a and a second vibratory member 2b in the embodiment) each including a piezoelectric element (expansion-and-contraction driver) 23, and a driving circuit 10 to apply voltages to the piezoelectric elements 23.

With reference to FIGS. 1 to 3, the driving unit 100 according to the embodiment further includes a supporting block 3 to support the rotor 1, and a cover 4 to cover the top of the driving unit 100.

The rotor 1 includes a cylindrical rotary body 11 and a rotary shaft 12 disposed at the radial center of the rotary body 11. The rotor 1 is rotatable around the axis of the rotary shaft 12 while being supported on the supporting block 3.

The supporting block 3 to support the rotor 1 has a substantially rectangular parallelepiped shape and is composed of a resin, for example. It is noted that materials of the supporting block 3 should not be limited to resins.

The supporting block 3 has a recess named a rotor supporting portion 31 at the substantial center in the longitudinal direction between both side portions.

The rotor supporting portion 31 has a shaft receiving opening 32 at the substantial center to receive the rotary shaft 12.

The depth of the rotor supporting portion 31 is determined such that the top of the rotary body 11 of the rotor 1 supported on the rotor supporting portion 31 is substantially flush with the top of the supporting block 3 after the shaft receiving opening 32 receives the rotary shaft 12 of the rotor 1.

The supporting block 3 further has engaging protrusions 33 on the tops of the side portions in the longitudinal direction, which engaging protrusions 33 are to fit in engaging openings 43 (described below) of the cover 4.

The vibratory members 2 (the first vibratory member 2a and the second vibratory member 2b according to the embodiment; the collective name "vibratory members 2" refers to both the first vibratory member 2a and the second vibratory member 2b) each include an action part 21 disposed to contact the outer periphery of the rotor 1, and a motional part 22 provided with the piezoelectric element (expansion-and-contraction driver) 23 that expands and contracts in response to applied voltage to slide the action part 21 in the rotational direction of the rotor 1.

Figure 4A:
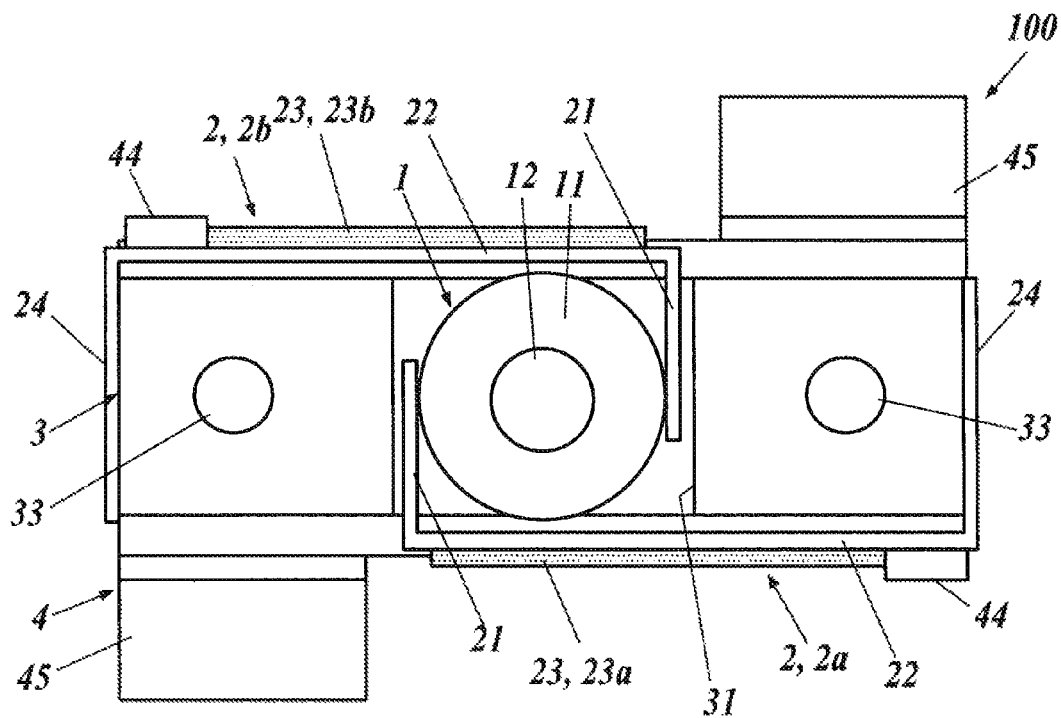
FIGS. 4A and 4B are each a top view of a driving unit according to the first embodiment, FIG. 4A illustrating piezoelectric elements under no applied voltage and FIG. 4B illustrating the piezoelectric elements under applied voltage.
Figure 4B:
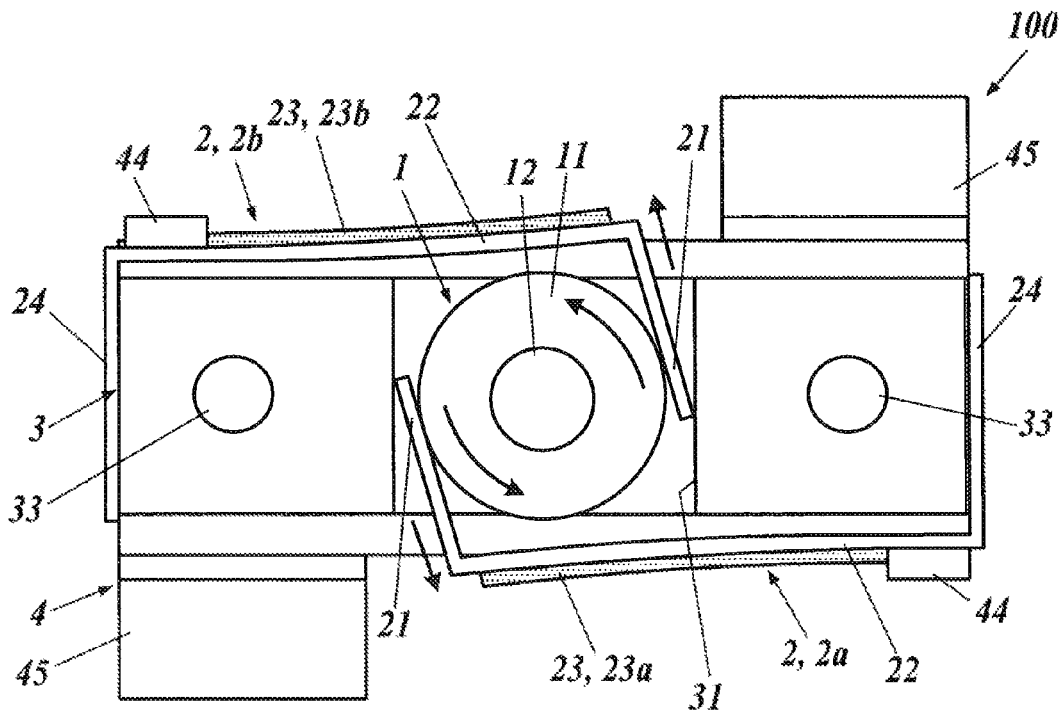

FIGS. 4A and 4B are plan views of the driving unit 100 according to the embodiment as viewed from the top (top in FIG. 2 or 3). In FIGS. 4A and 4B, a top plate 41 (described below) of the cover 4 is not depicted to show the internal structure.

With reference to FIGS. 4A and 4B, a pair of vibratory members 2 (the first vibratory member 2a and the second vibratory member 2b) is provided in the embodiment. Each of the vibratory members 2 includes an action part 21 and a motional part 22 orthogonal to each other and forming an L shape.

The vibratory member 2 according to the embodiment further includes a supporting part 24 at the base end (distant from the action part 21) of the motional part 22, which supporting part 24 is to be fixed to the supporting block 3. The vibratory member 2 is composed, for example, of a single thin metal plate that is shaped by bending.

The action part 21 and the motional part 22 of one of the vibratory members 2 (first vibratory member 2a) respectively face the action part 21 and the motional part 22 of the other vibratory member 2 (second vibratory member 2b), while the supporting parts 24 are fixed to the supporting block 3. The rotor 1 is held between the action parts 21 in the rotor supporting portion 31 of the supporting block 3. The action parts 21 are pushed against the rotor 1 to maintain the contact with the outer periphery of the rotary body 11.

Each of the motional parts 22 is a resilient thin plate. The surface (outer surface in the embodiment) of the motional part 22 is bonded to the piezoelectric element (expansion-and-contraction driver) 23. While the base end of the motional part 22 is fixed, the motional part 22 warps or returns in response to expansion and contraction of the piezoelectric element 23 such that the free end (including the action part 21) of the motional part 22 travels between a position adjacent to the supporting block 3 and a position away from the supporting block 3.

The piezoelectric element 23 bonded to the motional part 22 of the first vibratory member 2a is referred to as "first piezoelectric element 23a," and the piezoelectric element 23 bonded to the motional part 22 of the second vibratory member 2b is referred to as "second piezoelectric element 23b." The collective name "piezoelectric elements 23" refers to both the first piezoelectric element 23a and the second piezoelectric element 23b.

With reference to FIG. 5, the piezoelectric elements 23 (the first piezoelectric element 23a and the second piezoelectric element 23b) are connected to the driving circuit 10. The driving circuit 10 applies voltages having predetermined waveform patterns to the first piezoelectric element 23a and the second piezoelectric element 23b.

According to the embodiment, the piezoelectric elements 23 expand under no applied voltage. With reference to FIG. 4A, the motional parts 22 of the vibratory members 2 are substantially parallel with each other along the longitudinal direction of the supporting block 3, when no voltage is applied to the piezoelectric elements 23.

In contrast, the piezoelectric elements 23 contract when the voltage is applied. With reference to FIG. 4B, the motional parts 22 of the vibratory members 2 warp (bend) such that the free ends of the motional parts 22 move away from the supporting block 3 when the voltage is applied to the piezoelectric elements 23. The action parts 21 thus slide outward from the rotor supporting portion 31 while contacting the outer periphery of the rotary body 11 of the rotor 1, as illustrated with straight arrows in FIG. 4B. This operation rotates the rotor 1 in the normal rotational direction (counterclockwise direction in the embodiment), as illustrated with curved arrows in FIG. 4B.

After a stop of voltage application to the piezoelectric elements 23, the piezoelectric elements 23 restore the original expanded states such that the motional parts 22 restore the original parallel alignment.

Figure 6:
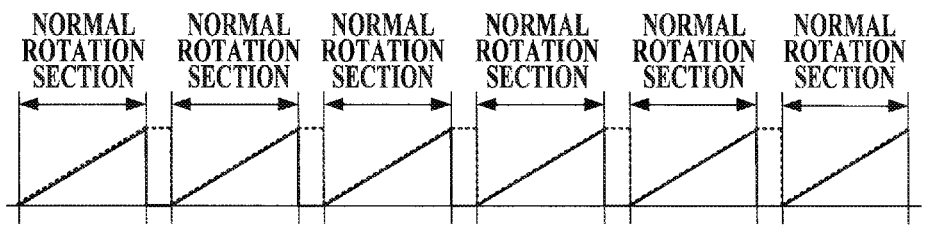
FIG. 6 illustrates example waveforms of voltages applied from the driving circuit in FIG. 5 to piezoelectric elements.

FIG. 6 illustrates waveform patterns of voltages applied from the driving circuit 10 to the first piezoelectric element 23a and the second piezoelectric element 23b according to the embodiment. FIG. 6 illustrates the waveform pattern of a voltage applied to the first piezoelectric element 23a with a solid line and that to the second piezoelectric element 23b with a broken line.

According to the embodiment, the driving circuit 10 applies voltages to the piezoelectric elements 23 in such a way that the speed at which the action parts 21 slide in the reverse rotational direction of the rotor 1 is higher than the speed at which the action parts 21 slide in the normal rotational direction of the rotor 1.

The driving circuit 10 applies voltages having different waveform patterns to the multiple vibratory members 2 (the first vibratory member 2a and the second vibratory member 2b in the embodiment).

With reference to FIG. 6, the driving circuit 10 according to the embodiment simultaneously applies gradually increasing voltages to the first piezoelectric element 23a and the second piezoelectric element 23b (during the normal rotation sections in FIG. 6). The voltage application to the first piezoelectric element 23a is stopped when the voltage reaches the maximum value, so that the voltage applied to the first piezoelectric element 23a is zero volts. The voltage application to the second piezoelectric element 23b is stopped after a lapse of a predetermined period since the reaching of the maximum voltage, so that the voltage applied to the second piezoelectric element 23b is zero volts. That is, the timing of stopping voltage application to the first piezoelectric element 23a is shifted from that to the second piezoelectric element 23b.

With reference to FIG. 6, the driving circuit 10 applies voltages having different waveform patterns to the first piezoelectric element 23a and the second piezoelectric element 23b. The action parts 21 slowly slide outward from the supporting block 3 at substantially the same timing to rotate the rotor 1 in the normal rotational direction (counterclockwise direction). Then, the action part 21 of the first vibratory member 2a alone rapidly slides inward of the supporting block 3 to rotate the rotor 1 in the reverse rotational direction (clockwise direction). After a lapse of the predetermined period, the action part 21 of the second vibratory member 2b rapidly slides inward of the supporting block 3 to rotate the rotor 1 in the reverse rotational direction (clockwise direction).

The "predetermined period" from the stop of the voltage application to the first piezoelectric element 23a to the stop of the voltage application to the second piezoelectric element 23b is, for example, about 1 relative to 5 of the normal rotation section. The "predetermined period" (i.e., a difference in timing) is appropriately determined on the basis of the size of the driving unit 100, the size and weight of the rotor 1, and the size and weight of a target (e.g., a gear 512 illustrated in FIG. 7) to be rotated together with the rotary shaft 12 of the rotor 1.

While the action part 21 is slowly sliding along the outer periphery of the rotor 1, the friction causes the rotor 1 to rotate with the sliding of the action part 21 in the same direction as the sliding direction. In contrast, while the action part 21 is rapidly sliding, the inertia causes the rotor 1 to slip from the action part 21 against the friction. That is, the rotor 1 rotating in a certain direction keeps its rotation without following the sliding action part 21.

While the two action parts 21 sandwiching the rotor 1 are substantially simultaneously sliding, the rotor 1 rotates with the sliding of the action parts 21 in the same direction as the sliding direction. In contrast, while the two action parts 21 are sliding at different timings, the rotor 1 is difficult to rotate due to the frictional resistance with static one of the action parts 21.

As described above, the rotor 1 can rotate in one direction by a difference in sliding speed between the action parts 21, and by a difference in timing for the recovery of the original states after the action parts 21 slide at the same timing.

The embodiment adopts both of the principles such that the two action parts 21 slowly slide outward from the supporting block 3 to rotate the rotor 1 in the normal rotational direction (counterclockwise direction in the embodiment) and then rapidly slide in the reverse rotational direction at timings different from each other. This operation further ensures the counterclockwise rotation of the rotor 1.

The cover 4 includes a rectangular top plate 41, a pair of terminal plates 44 disposed vertically from ends of the opposite longitudinal sides of the top plate 41 and symmetrically with respect to a point, and supporting parts 45 disposed vertically from the top plate 41 to face the respective terminal plates 44.

The cover 4 is composed, for example, of a single thin metal plate that is shaped by bending. It is noted that the shape and configuration of the cover 4 should not be limited to the illustrated example.

The top plate 41 covers the top of the driving unit 100.

The top plate 41 has a shaft receiving opening 42 at the substantial center to receive the rotary shaft 12.

The top plate 41 further has engaging openings 43 on both sides of the shaft receiving opening 42 at positions corresponding to the engaging protrusions 33 of the supporting block 3 such that the engaging protrusions 33 fit in the engaging openings 43 in an assembled state.

The fitting of the engaging protrusions 33 of the supporting block 3 in the engaging openings 43 fixes the cover 4 to the supporting block 3.

The terminal plates 44 are electrically connected to the piezoelectric elements 23 at the base ends of the motional parts 22. The terminal plates 44 are connected to the driving circuit 10. That is, the piezoelectric elements 23 are electrically connected to the driving circuit 10 via the terminal plates 44.

Figure 7:
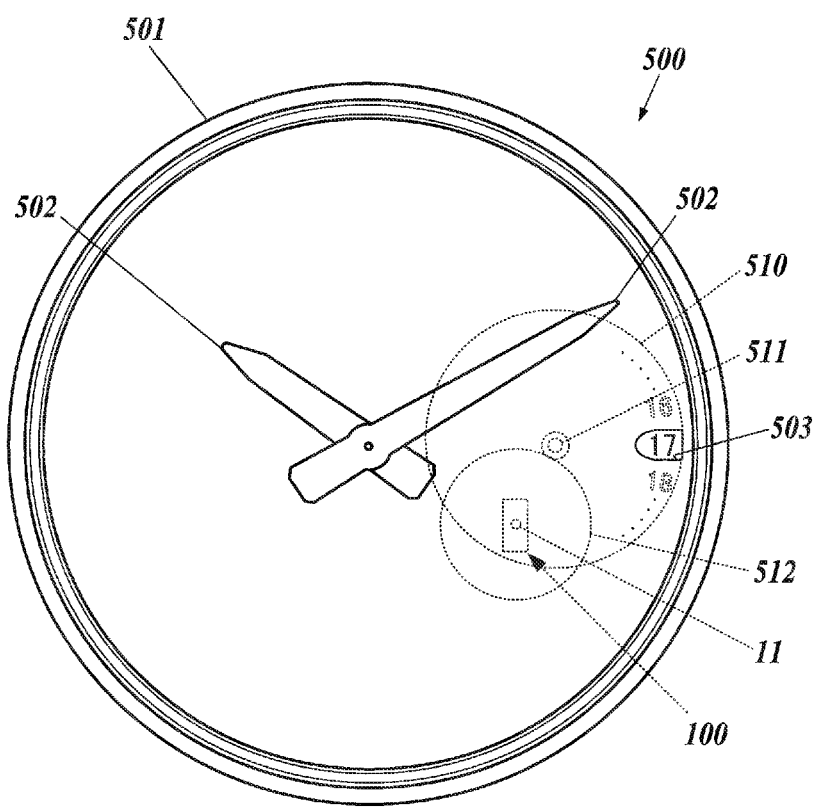
FIG. 7 is a plan view of a driving unit according to the first embodiment that is installed in a timepiece.

The supporting parts 45 are fixed to a base board or substrate (not shown), for example, if the driving unit 100 is installed in a timepiece case 501 (refer to FIG. 7).

The free end of each supporting part 45 is bent into an L shape. The supporting parts 45 are fixed to a base board or substrate with screws to install the driving unit 100 on the base board or substrate.

It is noted that the positions and shapes of the supporting parts 45 should not be limited to the illustrated example.

FIG. 7 illustrates the driving unit 100 installed in the timepiece case 501 of a timepiece 500 (e.g., a watch) including hands 502.

FIG. 7 illustrates the driving unit 100 according to the embodiment that rotates a disk indicator 510 for displaying a date with a numeral exposed through a date window 503.

With reference to FIG. 7, the rotary shaft 12 of the rotor 1 in the driving unit 100 is provided with a first gear 512. The first gear 512 engages with a pinion (small gear; not shown) provided at a rotary shaft 511 of the disk indicator 510.

The disk indicator 510 has sequential numerals (from 1 to 31) thereon along the periphery, the numerals indicating dates. The rotation of the rotor 1 in the driving unit 100 causes the disk indicator 510 to rotate around the rotary shaft 511 via the first gear 512, thereby switching the numeral exposed through the date window 503. This configuration can display a proper date.

The configuration for rotating the disk indicator 510 by the driving unit 100 should not be limited to the described example. The disk indicator 510 may be connected to the driving unit 100 via a further number of gears. Alternatively, the disk indicator 510 may be directly provided at the rotary shaft 12 of the rotor 1 in the driving unit 100.

It is noted that a target to be rotated by the driving unit 100 should not be limited to the disk indicator 510. The driving unit 100 according to the embodiment may rotate the hands 502, for example.

The operations of the driving unit 100 and the timepiece 500 including the driving unit 100 according to the embodiment will now be explained.

In order to assemble the driving unit 100 according to the embodiment, the rotor 1 is disposed in the rotor supporting portion 31 of the supporting block 3, as illustrated in FIG. 3.

The two vibratory members 2 are disposed on both sides of the supporting block 3 such that the action parts 21 face each other and the motional parts 22 face each other. The action parts 21 of the vibratory members 2a and 2b both reside in the rotor supporting portion 31 of the supporting block 3 while holding the rotary body 11 of the rotor 1 between the action parts 21.

The cover 4 is then disposed over the other components such that the top end of the rotary shaft 12 penetrates through the shaft receiving opening 42 and the engaging protrusions 33 of the supporting block 3 fit in the respective engaging openings 43. The terminal plates 44 of the cover 4 are in contact with the base ends of the respective piezoelectric elements 23 (the first piezoelectric element 23a and the second piezoelectric element 23b) provided on the motional parts 22 of the vibratory members 2a and 2b. This process completes the assembly of the driving unit 100.

In order to install the driving unit 100 into the timepiece 500, the supporting parts 45 of the cover 4 are fixed with screws to the base board or substrate in the timepiece case 501. A gear to be rotated is then attached to the rotary shaft 12.

In activation of the driving unit 100, the driving circuit 10 applies voltages having different waveform patterns to the first piezoelectric element 23a and the second piezoelectric element 23b.

In specific, the voltage applied to the first piezoelectric element 23a is gradually increased and is stopped (i.e., the applied voltage falls to zero volts) when the voltage reaches the maximum value, as illustrated in FIG. 6. The voltage applied to the second piezoelectric element 23b is gradually increased at the same timing as the voltage for the first piezoelectric element 23a, reaches the maximum value and is maintained at the maximum value for the predetermined period, and then is stopped (i.e., the applied voltage falls to zero volts) after a lapse of the predetermined period since the stop of the voltage application to the first piezoelectric element 23a.

In response to application of voltages having such waveform patterns to the first piezoelectric element 23a and the second piezoelectric element 23b, the piezoelectric elements 23 of the vibratory members 2 gradually contract at substantially the same timing. The motional parts 22 then warp outward to slowly slide the action parts 21 outward (in the directions illustrated with the straight arrows in FIG. 4B) along the outer periphery of the rotary body 11 of the rotor 1, as illustrated in FIG. 4B. The rotor 1 rotates in the normal rotational direction (counterclockwise direction illustrated with the curved arrows in FIG. 4B) with the sliding of the action parts 21.

When the applied voltage reaches the maximum value, the driving circuit 10 stops the application of voltage to the first piezoelectric element 23a of the first vibratory member 2a. The abrupt drop in the applied voltage causes the first piezoelectric element 23a to quickly restore the original expanded state, such that the action part 21 of the first vibratory member 2a immediately returns to the original position (as illustrated in FIG. 4A). Although the friction in the direction opposite to the normal rotational direction occurs between the action part 21 of the first vibratory member 2a and the rotary body 11 of the rotor 1, the inertia causes the rotor 1 to slip from the rapidly sliding action part 21 against the friction and to keep the rotation of the rotor 1 in the normal rotational direction (counterclockwise direction). At this time, the motional part 22 of the second vibratory member 2b maintains the outward warpage to maintain the attitude of the action part 21. The frictional resistance with the action part 21 of the second vibratory member 2b prevents the rotor 1 from rotating in the reverse rotational direction (clockwise direction in the embodiment; the direction opposite to the curved arrows in FIG. 4B). After a lapse of the predetermined period since the stop of voltage application to the first piezoelectric element 23a, the driving circuit 10 stops the application of voltage to the second piezoelectric element 23b of the second vibratory member 2b. The abrupt drop in the applied voltage causes the second piezoelectric element 23b to quickly restore the original expanded state, such that the action part 21 of the second vibratory member 2b immediately returns to the original position (as illustrated in FIG. 4A). Although the friction in the direction opposite to the normal rotational direction occurs between the action part 21 of the second vibratory member 2b and the rotary body 11 of the rotor 1, the inertia causes the rotor 1 to slip from the rapidly sliding action part 21 against the friction and to keep the rotation of the rotor 1 in the normal rotational direction (counterclockwise direction). At this time, the motional part 22 of the first vibratory member 2a is at the original position and maintains the attitude of the action part 21. The frictional resistance with the action part 21 of the first vibratory member 2a prevents the rotor 1 from rotating in the reverse rotational direction (clockwise direction in the embodiment; the direction opposite to the curved arrows in FIG. 4B).

Repeated application of voltages having such waveform patterns allows the rotor 1 to keep its rotation in the normal rotational direction (counterclockwise direction illustrated with the curved arrows in FIG. 4B).

According to the embodiment, multiple vibratory members 2 (a pair of vibratory members 2a and 2b according to the embodiment) are disposed in such a way that the action parts 21 of the vibratory members 2 hold the rotor 1 between the action parts 21. The piezoelectric elements 23 contract under applied voltage to warp the motional parts 22, such that the action parts 21 adjoining the motional parts 22 slide in the normal rotational direction of the rotor 1. This relatively simple structure can reduce the size and weight of the timepiece 500 including the driving unit 100, while achieving stable rotation of the rotor 1. The rotor 1 held by the multiple action parts 21 is less likely to cause vibrations of the rotational axis, thereby achieving more stable rotation of the rotor 1, in comparison to the rotor 1 held at one side.

According to the embodiment, a pair of vibratory members 2, each including the action part 21 and the motional part 22 orthogonal to each other to form an L shape, are disposed in such a way that the action parts 21 face each other and that the motional parts 22 face each other. The two opposed action parts 21 hold the rotor 1 therebetween without uneven stress on the rotor 1. This configuration can stably and certainly rotate the rotor 1.

The driving circuit 10 applies voltages to the piezoelectric elements 23 in such a way that the speed at which the action parts 21 slide in the reverse rotational direction (clockwise direction in the embodiment) of the rotor 1 is higher than the speed at which the action parts 21 slide in the normal rotational direction (counterclockwise direction in the embodiment) of the rotor 1. This operation gently provides a frictional force between the action parts 21 and the rotor 1 to apply a turning force in the normal rotational direction to the rotor 1. Once the rotor 1 rotates in the normal rotational direction, the inertia allows the rotating rotor 1 to keep its rotation. The rotor 1 can thus keep its rotation in the normal rotational direction while the action parts 21 are returning to the original positions.

The driving circuit 10 applies voltages having different waveform patterns to the piezoelectric elements 23 (the first piezoelectric element 23a and the second piezoelectric element 23b) of the vibratory members 2. In specific, after a lapse of a predetermined period since the stop of voltage application to the first piezoelectric element 23a, the voltage application to the second piezoelectric element 23b is stopped according to the embodiment. With such different timings of stopping the voltage application (or decreasing the applied voltage), the action part 21 of one of the vibratory members 2 causes friction resistance while the action part 21 of other of the vibratory members 2 is returning to its original position. This prevents the rotor 1 from rotating in the reverse rotational direction (clockwise direction in the embodiment) or from stopping due to the turning force in the reverse rotational direction.

The driving unit 100 according to the embodiment rotates the rotor 1 by a slight angle by vibrations of the vibratory members 2. The driving unit 100 thus requires a reduced number of gears for reducing the rotation speed of the motor, in comparison to a stepping motor, for example. The driving unit 100 may directly rotate a target without gears depending on the number of revolutions of the target. This configuration can reduce the number of components and can reduce the size and weight of the entire device such as the timepiece 500.

Second Embodiment

A driving unit and a timepiece including the driving unit according to a second embodiment of the invention will now be described with reference to FIGS. 8 to 11A and 11B. The second embodiment differs from the first embodiment only in the configurations of a top plate and terminal plates. The following description focuses on differences from the first embodiment.

Figure 8:
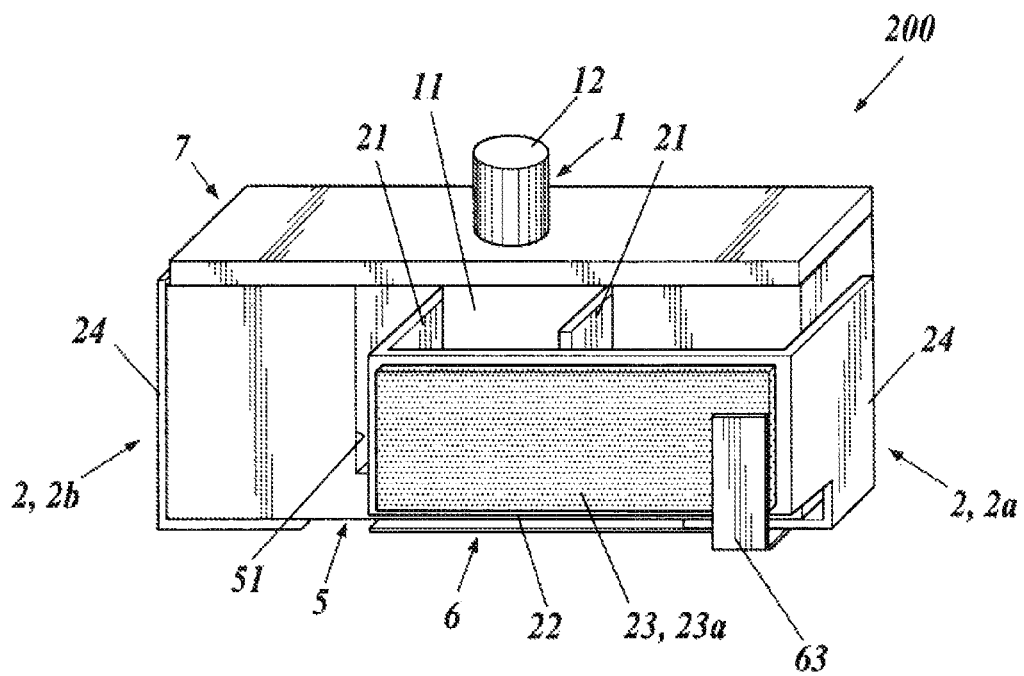
FIG. 8 is a perspective view of a driving unit according to a second embodiment.
Figure 9:
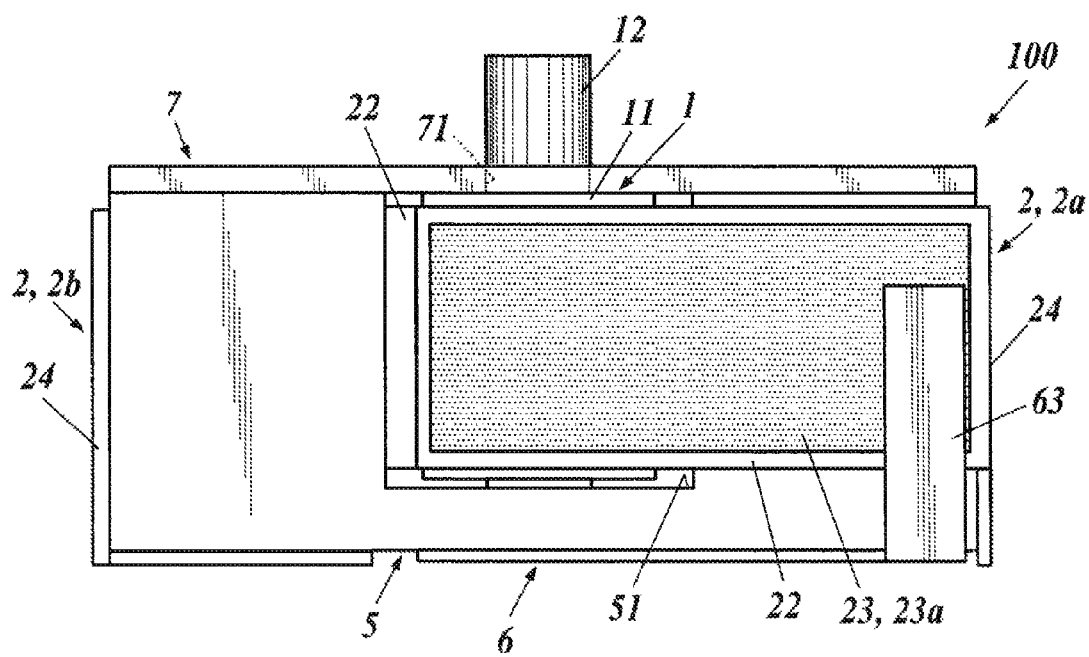
FIG. 9 is a side view of a driving unit according to the second embodiment.
Figure 10:
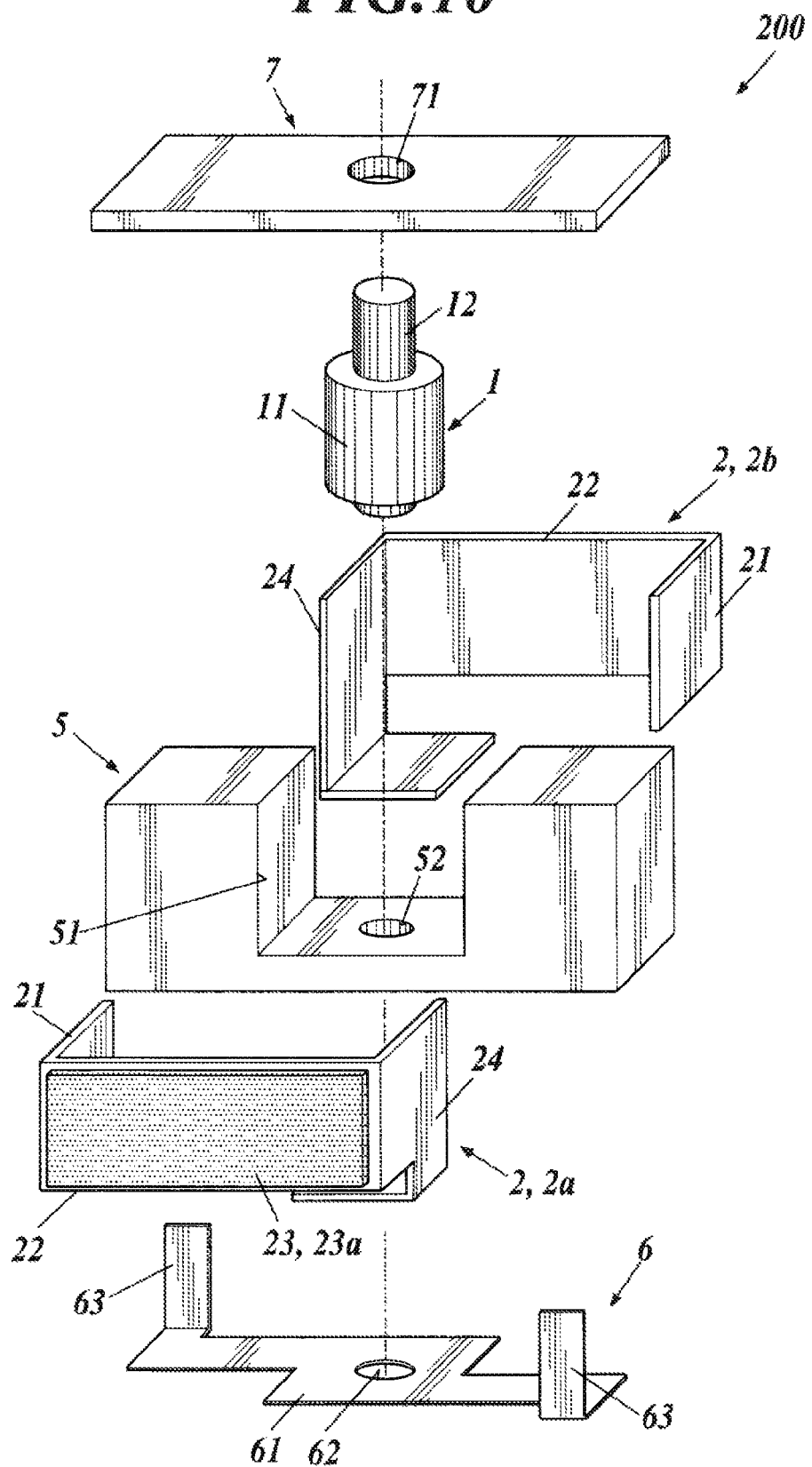
FIG. 10 is an exploded perspective view of a driving unit according to the second embodiment.

FIG. 8 is a perspective view of a driving unit according to the embodiment. FIG. 9 is a side view of the driving unit in FIG. 8. FIG. 10 is an exploded perspective view of the driving unit in FIG. 8.

With reference to FIGS. 8 to 10, a driving unit 200 includes a rotor 1 and a pair of vibratory members 2 as in the first embodiment.

According to the embodiment, a supporting block 5 to support the rotor 1 has a rotor supporting portion 51 at the substantial center in the longitudinal direction, as in the first embodiment. The rotor supporting portion 51 has a shaft receiving opening 52 at the substantial center to receive the rotary shaft 12.

The driving unit 200 further includes a bottom member 6. The bottom member 6 has a rectangular bottom plate 61 to cover the bottom of the driving unit 200, and a pair of terminal plates 63 disposed vertically from ends of the opposite longitudinal sides of the bottom plate 61 symmetrical with respect to a point.

The bottom plate 61 has an opening 62 at the substantial center corresponding to the shaft receiving opening 52 of the supporting block 5, the opening 62 receiving the rotary shaft 12.

The bottom member 6 is composed, for example, of a single thin metal plate that is shaped by bending. It is noted that the shape and configuration of the bottom member 6 should not be limited to the illustrated example.

The driving unit 200 further includes a rectangular top plate 7 to cover the top of the driving unit 200. The top plate 7 has a shaft receiving opening 71 at the substantial center to receive the top end of the rotary shaft 12.

The other components are identical to those in the first embodiment and thus are referred to by the same reference signs without redundant description.

The operations of the driving unit 200 and the timepiece 500 including the driving unit 200 according to the embodiment will now be explained.

In order to assemble the driving unit 200 according to the embodiment, the supporting block 5 is disposed on the bottom plate 61 of the bottom member 6, and the rotor 1 is disposed in the rotor supporting portion 51 of the supporting block 5, as illustrated in FIG. 10. The rotary shaft 12 is disposed so as to penetrate through the shaft receiving opening 52 of the supporting block 5 and the opening 62 of the bottom member 6.

The two vibratory members 2 are disposed on both sides of the supporting block 5 such that the action parts 21 face each other and the motional parts 22 face each other. The action parts 21 of the vibratory members 2a and 2b both reside in the rotor supporting portion 51 of the supporting block 5 while holding the rotary body 11 of the rotor 1 between the action parts 21. The terminal plates 63 of the bottom member 6 are in contact with the base ends of the respective piezoelectric elements 23 (the first piezoelectric element 23a and the second piezoelectric element 23b) provided on the motional parts 22 of the vibratory members 2a and 2b.

The top plate 7 is then disposed over the other components such that the top end of the rotary shaft 12 penetrates through the shaft receiving opening 71 of the top plate 7. This process completes the assembly of the driving unit 200.

The process of assembling the timepiece 500 is identical to that in the first embodiment and the redundant explanation thereof is omitted.

Figure 11A:
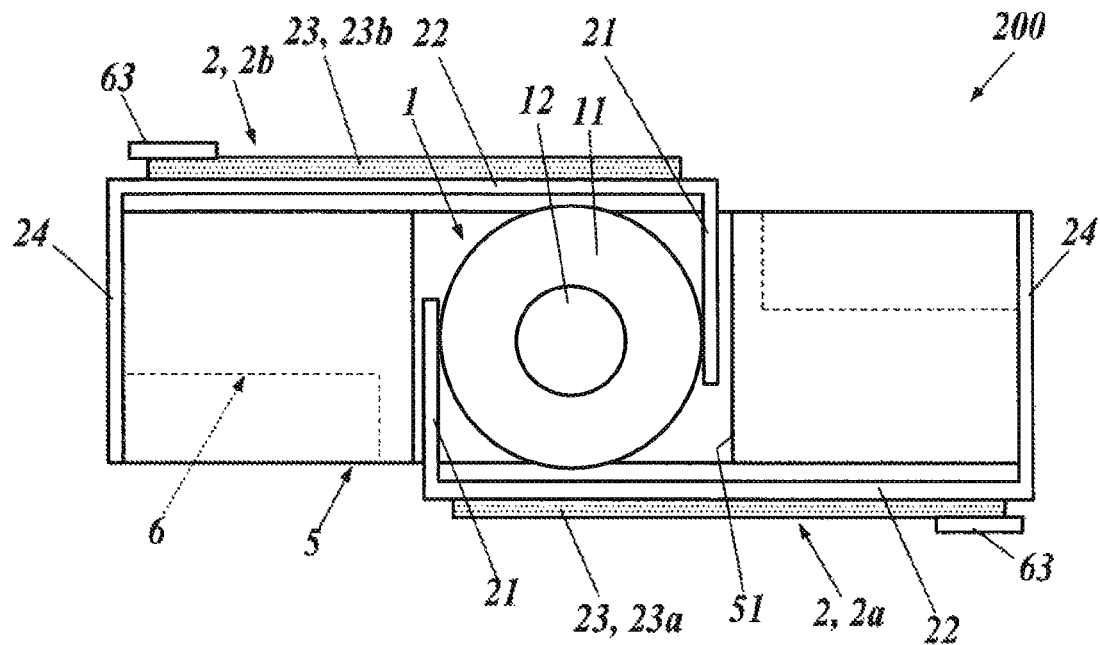
FIGS. 11A and 11B are each a top view of a driving unit according to the second embodiment, FIG. 11A illustrating piezoelectric elements under no applied voltage and FIG. 11B illustrating the piezoelectric elements under applied voltage.
Figure 11B:
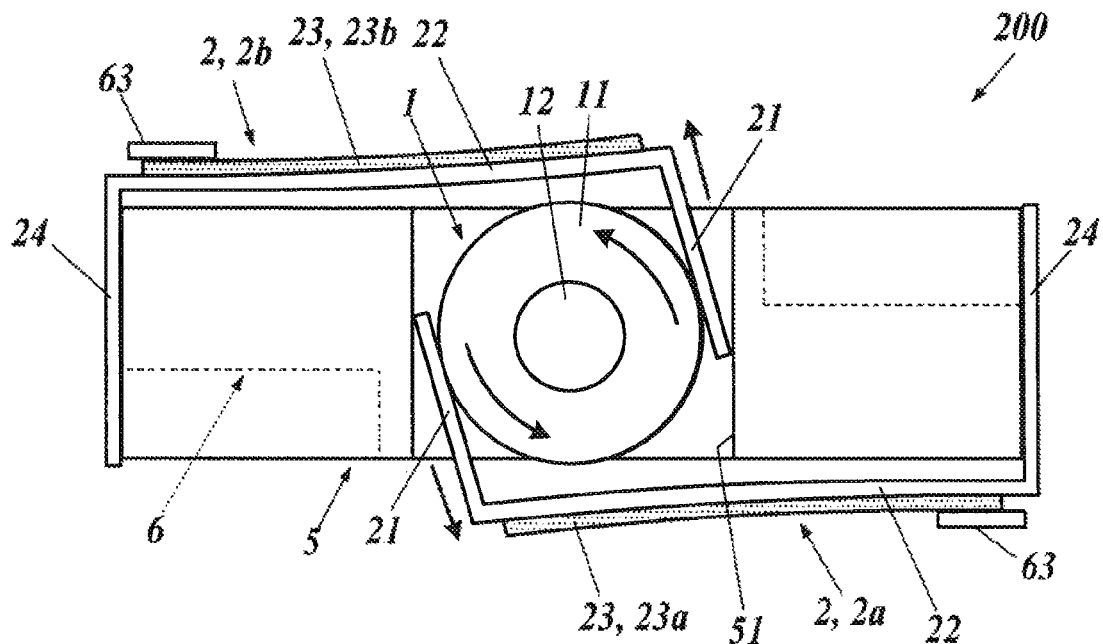

In activation of the driving unit 200, the driving circuit 10 applies voltages to the piezoelectric elements 23 to warp the motional parts 22 such that the action parts 21 slide in the normal rotational direction (counterclockwise direction in the embodiment) of the rotor 1, as in the first embodiment. This operation rotates the rotor 1 in the normal rotational direction (counterclockwise direction in the embodiment), as illustrated in FIGS. 11A and 11B. The voltages applied from the driving circuit 10 to the piezoelectric elements 23 are gradually increased and are stopped (i.e., the applied voltage falls to zero volts) when the voltages reach the maximum value. The driving circuit 10 applies voltages to the piezoelectric elements 23 in such a way that the speed at which the action parts 21 slide in the reverse rotational direction (clockwise direction in the embodiment) of the rotor 1 is higher than the speed at which the action parts 21 slide in the normal rotational direction (counterclockwise direction in the embodiment) of the rotor 1. This operation gently provides a frictional force between the action parts 21 and the rotor 1 to apply a turning force in the normal rotational direction to the rotor 1. Then, the inertia causes the rotating rotor 1 to keep its rotation while the action parts 21 are returning to the original positions. The rotor 1 can thus keep rotating in the normal rotational direction.

The driving circuit 10 applies voltages having different waveform patterns to the piezoelectric elements 23 (the first piezoelectric element 23a and the second piezoelectric element 23b) of the vibratory members 2. In specific, after a lapse of a predetermined period since the stop of voltage application to the first piezoelectric element 23a, the voltage application to the second piezoelectric element 23b is stopped according to the embodiment. With such different timings of stopping the voltage application (or decreasing the applied voltage), the action part 21 of one of the vibratory members 2 causes friction resistance while the action part 21 of the other vibratory member 2 is returning to the original position. This prevents the rotor 1 from rotating in the reverse rotational direction (clockwise direction in the embodiment) or from stopping due to the turning force in the reverse rotational direction.

The other operations are identical to those in the first embodiment and the redundant explanation thereof is omitted.

As described above, the second embodiment can provide the same advantageous effects as the first embodiment and additional advantageous effects below.

According to the second embodiment, the supporting block 5 is held between the top plate 7 above and the bottom member 6 below in the driving unit 200. This configuration can reduce the weight of the driving unit 200 with a relatively simple structure.

The invention should not be limited to the embodiments described above, and the embodiments may be variously modified within the gist of the invention.

For example, although the applied voltages have different waveform patterns between the first piezoelectric element 23a and the second piezoelectric element 23b according to the embodiments, the voltages applied to the first piezoelectric element 23a and the second piezoelectric element 23b have any waveform pattern.

Figure 12:
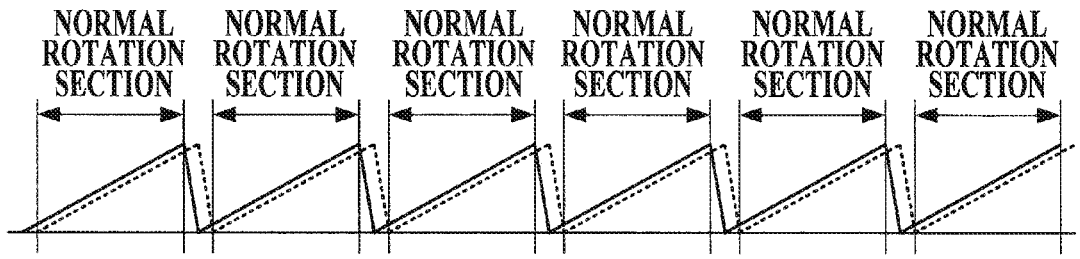
FIG. 12 illustrates example waveforms of voltages applied from a driving circuit to piezoelectric elements according to a modified embodiment.

With reference to FIG. 12, voltages having the same waveform pattern may be applied to the first piezoelectric element 23a and the second piezoelectric element 23b at different timings, for example.

In this case, at the part where the section in which the voltage is applied to the first piezoelectric element 23a and the section in which the voltage is applied to the second piezoelectric element 23b do not coincide with each other, the action part 21 of one of the vibratory members 2 slides along the rotary body 11 of the rotor 1 to rotate the rotor 1 whereas the action part 21 of the other vibratory member 2 causes a frictional resistance to inhibit the rotation of the rotor 1. Accordingly, a turning force in the normal rotational direction is applied to the rotor 1 only while the section in which the voltage is applied to the first piezoelectric element 23a and the section in which the voltage is applied to the second piezoelectric element 23b coincide with each other (i.e., during the "normal rotation sections" in FIG. 12). Once the rotor 1 rotates in a certain direction, the inertia allows the rotating rotor 1 to keep its rotation even while the action part 21 is returning to the original position (i.e., sliding in the direction opposite to the normal rotational direction of the rotor 1).

If voltages having the same waveform pattern are applied to the first piezoelectric element 23a and the second piezoelectric element 23b at different timings, the difference in timing of voltage application is preferably equal to a time required for the recovery of each of the action parts 21 to the original state. For example, if the voltages gradually increase during the nine-tenths of a cycle of the voltage waveform and rapidly drop during one-tenth of the cycle, the difference in timing of voltage application between the first piezoelectric element 23a and the second piezoelectric element 23b should be equal to one-tenth of the cycle. This configuration can maximize the normal rotation sections enabling stable rotation of the rotor 1, and can utilize the frictional resistance between the rotor 1 and one of the action parts 21 while the other of the action parts 21 is returning to its original position, thereby preventing the reverse rotation of the rotor 1.

The technique of utilizing a difference in timing of voltage application can eliminate generation of voltages having multiple waveform patterns by the driving circuit 10, thereby reducing the loads on the driving circuit 10.

According to the embodiments, the action parts 21 slide at different speeds such that the action parts 21 slowly slide outward from the supporting block 3 to rotate the rotor 1 in the normal rotational direction (counterclockwise direction in the embodiment) and rapidly slide in the reverse rotational direction; and the two action parts 21 slide in the direction opposite to the normal rotational direction of the rotor 1 at different timings.

Alternatively, either one of the these techniques may be adopted to rotate the rotor 1, because the rotor 1 can rotate in one direction only by a difference in speed of the action parts 21, and only by a difference in timing for the recovery to the original states after the two action parts 21 slide at the same timing.

For example, if a rotation target attached to the rotary shaft of the rotor 1 has a certain weight, the inertia allows the rotor 1 to keep rotating in the normal rotational direction using the technique alone in which the action parts 21 slowly slide outward from the supporting block 3 to rotate the rotor 1 in the normal rotational direction (counterclockwise direction in the embodiment) and rapidly slide in the reverse rotational direction.

Although the expansion-and-contraction driver is the piezoelectric element 23 according to the embodiments, the expansion-and-contraction driver may be any component that expands and contracts in response to applied voltage other than the piezoelectric element.

For example, the expansion-and-contraction driver may be a thin-plate conductive polymer actuator including multiple electrode layers sandwiching an electrolyte layer. When a voltage is applied to the conductive polymer actuator, ions in the electrolyte layer move to expand molecules near an electrode, so that the actuator is physically deformed to cause warpage in the plate portion. Such a conductive polymer actuator can cause warpage in the motional part 22 under applied voltage, when bonded to the motional part 22.

Although the normal rotational direction of the rotor 1 is counterclockwise according to the embodiments, the normal rotational direction may be clockwise rather than counterclockwise. In this case, the action parts 21 slowly slide inward of the supporting block 3 and rapidly slide outward from the supporting block 3, for example, to rotate the rotor 1 in the clockwise direction. If the two action parts 21 are to slide at different timings, the action parts 21 should return to the original positions (in this case, the positions distant from the supporting block 3) at different timings.

Alternatively, the rotor 1 may be rotatable in both the normal and reverse rotational directions in response to switching of control signals.

Instead of the two vibratory members 2 according to the embodiments, any number of vibratory members 2 may be provided.

Figure 13:
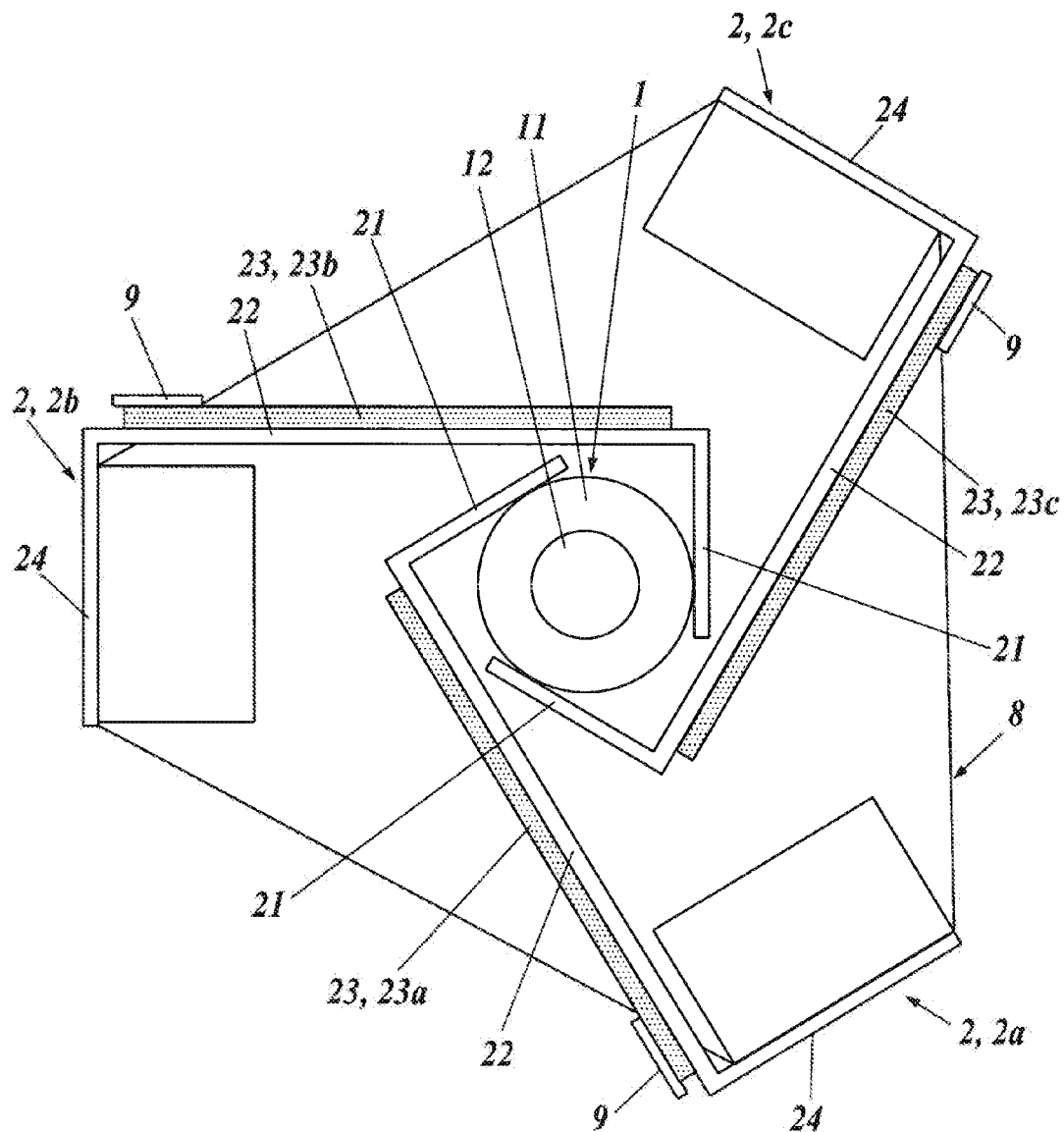
FIG. 13 is a top view of a driving unit according to a modified embodiment.

For example, as illustrated in FIG. 13, three vibratory members 2 (2a, 2b, and 2c) may be disposed on the bottom member 8 such that action parts 21 of the vibratory members 2a, 2b, and 2c are in contact with the outer periphery of the rotary body 11 of the rotor 1 at substantially regular intervals. Motional parts 22 of the vibratory members 2a, 2b, and 2c are provided with piezoelectric elements 23 (23a, 23b, and 23c) electrically connected to a driving circuit 10 via terminal plates 9.

In this case, the piezoelectric elements 23a, 23b, and 23c may receive voltages having different waveform patterns, or may receive voltages having the same waveform pattern at different timings. The ways of varying the waveform pattern and shifting the timing of voltage application for the two vibratory members 2 according to the embodiments can be applied to this case.

The number of vibratory members 2 should not be limited to three, and four or more vibratory members 2 may be provided.

As the number of vibratory members 2 increases, higher turning force can be applied to the rotor 1 to increase the driving force of the driving unit.

Although the driving unit 100 or 200 is installed in the timepiece 500 according to the embodiments, the driving unit 100 or 200 may be installed in any device other than the timepiece 500.

For example, the driving unit 100 or 200 may be installed in a terminal device, such as pedometer, heart rate meter, altimeter, or barometer.

The invention is not intended to be limited to the embodiments described above but rather is defined by the following claims and equivalents thereof.

The entire disclosure of Japanese Patent Application No. 2013-184915 filed on Sep. 6, 2013 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A driving unit comprising:
a rotor;
a plurality of vibratory members each comprising:
an action part in contact with an outer periphery of the rotor, and
a motional part comprising an expansion-and-contraction driver to expand and contract in response to an applied voltage, the motional part allowing the action part to slide along a rotational direction of the rotor; and
a driving circuit to apply voltages to the expansion-and-contraction drivers, wherein
the vibratory members are disposed in such a way that the action parts of the vibratory members hold the rotor between the action parts; and
the driving circuit applies the voltages to the expansion-and-contraction drivers in such a way that a speed at which each of the action parts slides in a reverse rotational direction of the rotor is higher than a speed at which each of the action parts slides in a normal rotational direction of the rotor.

2. The driving unit according to claim 1, wherein
the vibratory members comprises a pair of vibratory members, each of the pair of vibratory members including the action part and the motional part orthogonal to each other to form an L shape, and
the action part of one of the pair of vibratory members faces the action part of the other of the pair of vibratory members, and the motional part of the one of the pair of vibratory members faces the motional part of the other of the pair of vibratory members.

3. A driving unit comprising:
a rotor;
a plurality of vibratory members each comprising:
an action part in contact with an outer periphery of the rotor, and
a motional part comprising an expansion-and-contraction driver to expand and contract in response to an applied voltage, the motional part allowing the action part to slide along a rotational direction of the rotor; and
a driving circuit to apply voltages to the expansion-and-contraction drivers, wherein
the vibratory members are disposed in such a way that the action parts of the vibratory members hold the rotor between the action parts; and
the driving circuit applies the voltages having different waveform patterns for the different vibratory members.

4. The driving unit according to claim 3, wherein
the vibratory members comprises a pair of vibratory members, each of the pair of vibratory members including the action part and the motional part orthogonal to each other to form an L shape, and
the action part of one of the pair of vibratory members faces the action part of the other of the pair of vibratory members, and the motional part of the one of the pair of vibratory members faces the motional part of the other of the pair of vibratory members.

5. The driving unit according to claim 1, wherein the driving circuit applies the voltages having different waveform patterns for the different vibratory members.

6. The driving unit according to claim 2, wherein the driving circuit applies the voltages having different waveform patterns for the different vibratory members.

7. The driving unit according to claim 1, wherein the driving circuit applies the voltages at different timings for the different vibratory members.

8. The driving unit according to claim 2, wherein the driving circuit applies the voltages at different timings for the different vibratory members.

9. The driving unit according to claim 3, wherein the driving circuit applies the voltages at different timings for the different vibratory members.

10. The driving unit according to claim 4, wherein the driving circuit applies the voltages at different timings for the different vibratory members.

11. The driving unit according to claim 5, wherein the driving circuit applies the voltages at different timings for the different vibratory members.

12. The driving unit according to claim 6, wherein the driving circuit applies the voltages at different timings for the different vibratory members.

13. A timepiece comprising:
the driving unit according to claim 1; and
a timepiece case.
14. A timepiece comprising:
the driving unit according to claim 2; and
a timepiece case.
15. A timepiece comprising:
the driving unit according to claim 3; and
a timepiece case.
16. A timepiece comprising:
the driving unit according to claim 4; and
a timepiece case.

* * * * *